US007649739B2

(12) United States Patent
Murai et al.

(10) Patent No.: US 7,649,739 B2
(45) Date of Patent: Jan. 19, 2010

(54) CIRCUIT DEVICE

(75) Inventors: Makoto Murai, Isehara (JP); Ryosuke Usui, Ichinomiya (JP); Yasuhiro Kohara, Gifu-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 309 days.

(21) Appl. No.: 11/526,875

(22) Filed: Sep. 26, 2006

(65) Prior Publication Data
US 2007/0164766 A1 Jul. 19, 2007

(30) Foreign Application Priority Data
Sep. 26, 2005 (JP) .............................. 2005-278017

(51) Int. Cl.
*H05K 5/00* (2006.01)
(52) U.S. Cl. ...................... 361/701; 361/760; 361/687; 361/688; 361/691; 361/697; 361/702; 361/704; 361/709; 361/711
(58) Field of Classification Search ................ 361/760, 361/701–723, 687, 688, 691, 692, 697; 257/720, 257/707, 706, 713; 174/252, 259, 260, 268, 174/50.5, 50.51, 50, 56, 548, 537, 526, 552–556, 174/559, 563
See application file for complete search history.

(56) References Cited

U.S. PATENT DOCUMENTS

| 5,646,831 | A | * | 7/1997 | Manteghi ..................... 361/813 |
| 2004/0144561 | A1 | * | 7/2004 | Osanai et al. ................ 174/252 |
| 2005/0047101 | A1 | * | 3/2005 | Osanai ........................ 361/760 |
| 2005/0254220 | A1 | * | 11/2005 | Brinkis et al. ................ 361/760 |
| 2006/0232943 | A1 | * | 10/2006 | Tseng et al. ................. 361/719 |
| 2008/0106875 | A1 | * | 5/2008 | Igarashi et al. .............. 361/760 |

FOREIGN PATENT DOCUMENTS

JP 5-121603 5/1993

* cited by examiner

*Primary Examiner*—Dean A. Reichard
*Assistant Examiner*—Hoa C Nguyen
(74) *Attorney, Agent, or Firm*—McDermott Will & Emery LLP

(57) ABSTRACT

A circuit device having superior mechanical strength at the interface between a circuit board and heat sink and superior efficiency for radiating heat from a circuit element to the heat sink through the circuit board. The circuit device includes the metal-based insulation board for installing the circuit element, and the heat sink, over which the insulation board is installed with a paste arranged therebetween. The insulation board has a projection arranged on the surface facing the heat sink along a peripheral portion. At least part of the projection contacts the heat sink through the paste layer.

10 Claims, 14 Drawing Sheets

CIRCUIT DEVICE

This application is based upon and claims the benefit of priority from the prior Japanese Patent Application No. 2005-278017, filed on Sep. 26, 2005, the entire contents of which are incorporated herein by reference.

BACKGROUND OF THE INVENTION

The present invention relates to a circuit device.

Figure 1:
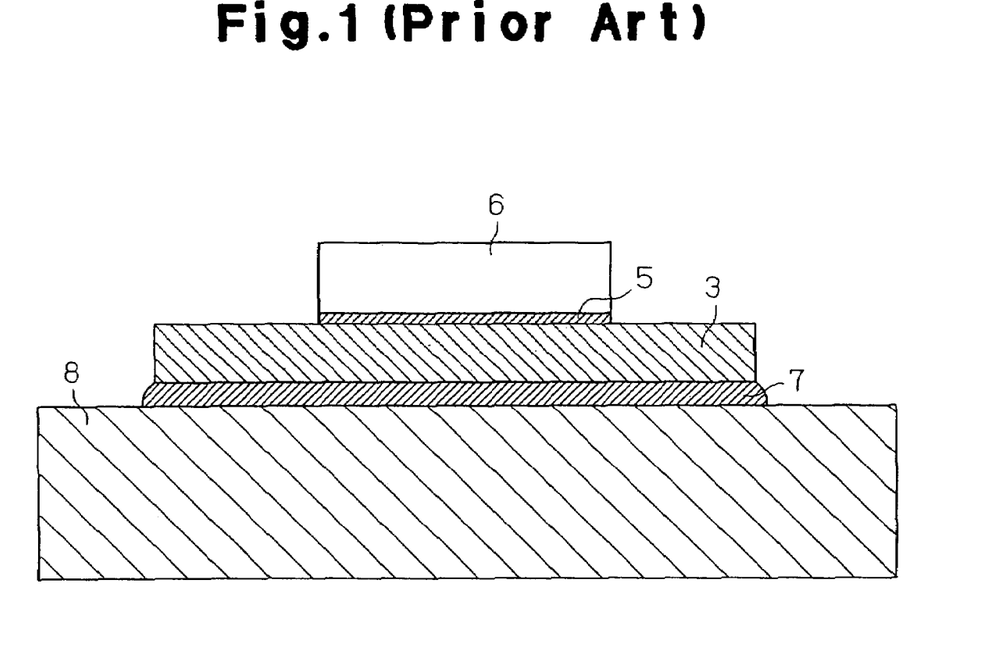
FIG. 1 is a schematic cross-sectional view showing the structure of a conventional circuit device.

Electronic circuit devices conventionally include electronic circuits installed on a metal-based circuit board. The circuit board is bonded on a heat sink (base substrate), which is used to transfer heat. FIG. 1 is a cross-sectional view briefly schematically showing a conventional circuit device. A circuit element 6, which is a heat-generating body, is adhered to a circuit board 3 with solder 5, and the circuit board 3 is adhered to a heat sink 8 via an adhesive layer 7. When the circuit board 3 and heat sink 8 are adhered by means of the adhesive layer 7, the adhesive layer 7 may harden such that the circuit board 3 is in an inclined state relative to the heat sink 8. This causes the thickness of the adhesive layer 7 to become uneven and reduces the thermal transfer efficiency between the element 6 on the board 3 and the heat sink 8. Moreover, the thermal expansion difference increases between the board 3 and the heat sink 8 such that cracks are generated in the adhesive layer 7 so as to cause concern that the board 3 may separate from the heat sink 8. To address this problem, Japanese Laid-Open Patent Publication No. 5-121603 describes art in which a spacer is provided between the circuit board 3 and the heat sink 8 so as to make the adhesive layer 7 have a uniform thickness.

Figure 2:
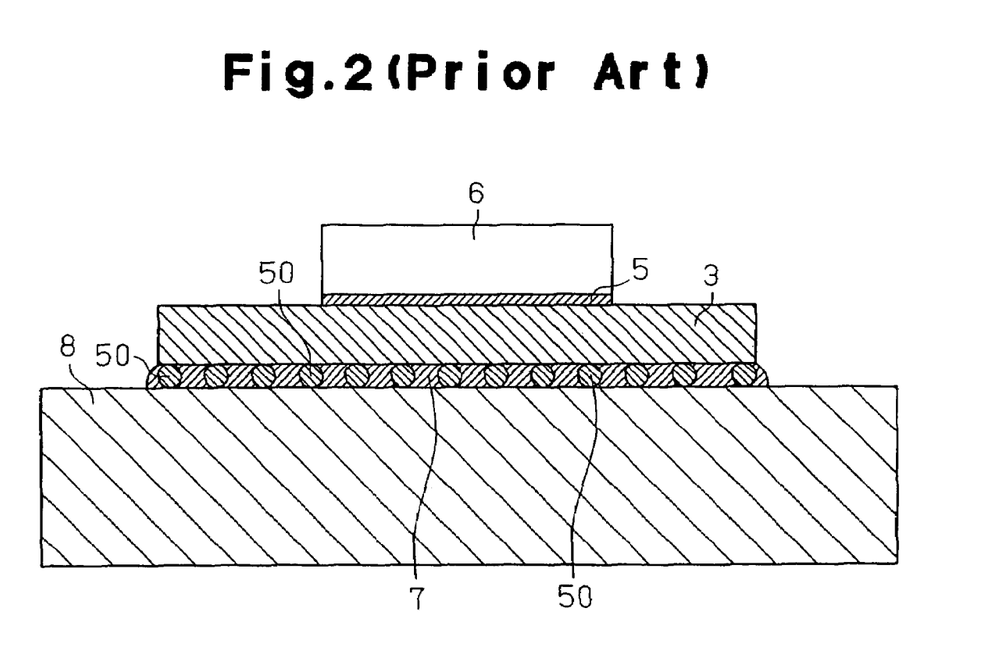
FIG. 2 is a schematic cross-sectional view showing the structure of a conventional circuit device.

FIG. 2 is a schematic cross-sectional diagram of a hybrid integrated circuit device introduced in the above publication. A circuit element 6, which includes a heat-radiating body such as a power transistor or the like, is fixed to a board 3 with solder 5. Spacers 50 are mixed into an adhesive layer 7 and applied to the heat sink 8. The board 3 is adhered to the heat sink 8 by means of the spacers 50. The spacers 50 are formed from a material that has satisfactory thermal conductivity and include, for example, metal grains having the same diameter or short glass fibers having the same length.

The circuit device of FIG. 2, however, can not ensure sufficient friction force between the board 3 and spacers 50 and between the spacers 50 and the heat sink 8 when the board 3 is adhered to the heat sink 8. Therefore, the board 3 is unstable with regard to external forces when the adhesive layer 7 is cured such that the board 3 may easily move. Accordingly, positioning of the board 3 is difficult. Furthermore, there is a possibility that the board 3 may be displaced from its designated position on the heat sink 8 and be fixed at that position.

SUMMARY OF THE INVENTION

The present invention provides a circuit device in which the circuit board is easily positioned and stably fixed on a base substrate so that the circuit board does not become inclined or displaced relative to the base substrate.

One aspect of the present invention is a circuit device including a base member. A circuit board is arranged over the base member. The circuit board has a peripheral portion and a first surface facing toward the base member. A paste is arranged between the circuit board and the base member. The circuit board includes a projection arranged on the first surface along the peripheral portion, with at least part of the projection extending through the paste and contacting the base member.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

In the drawings, like numerals are used for like elements throughout.

A circuit device 10 according to a further embodiment of the present invention will now be discussed with reference to the drawings.

Figure 3:
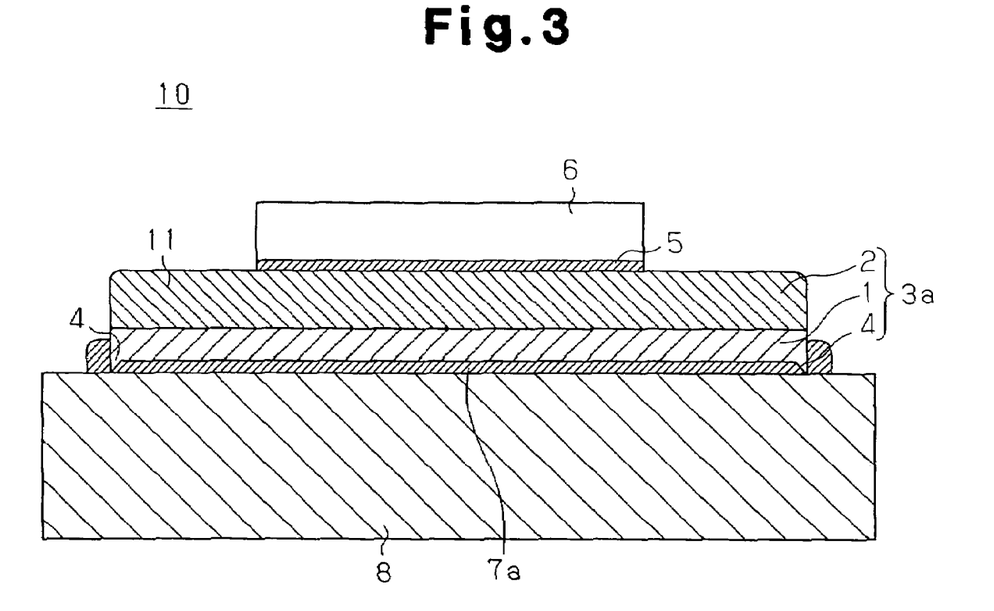
FIG. 3 is a schematic cross-sectional view of a circuit device according to a preferred embodiment of the present invention.

FIG. 3 is a schematic side view showing a cross-section of the circuit device 10. The circuit device 10 is provided with a metal-based insulation board 3a. The insulation board 3a includes a metal substrate 1 and a wiring layer 2 formed thereon. The wiring layer 2 is formed by laminating an insulative layer and a conductive layer. A projection 4 extends downward from a peripheral portion of the bottom surface of the metal substrate 1, which defines a lower surface of the insulation board 3a. A circuit element 6 is fixed to the upper surface of the insulation board 3a with solder 5. The insulation board 3a is placed on a heat sink 8 with a heat radiating grease 7a arranged in between. At least part of the projection 4 formed on the bottom surface of the metal substrate 1 extends through the heat radiating grease 7a so that a distal portion of the projection 4 comes into contact with the heat sink 8.

In FIG. 3, the circuit element 6 serves as a "circuit element" of the present invention, the metal-based insulation board 3a serves as a "circuit board" of the present invention, the metal substrate 1 serves as a "metal substrate" of the present invention, the projection 4 serves as a "projection" of the present invention, the heat radiating grease 7a serves as a "paste" of the present invention, and the heat sink 8 serves as a "base member" of the present invention.

Figure 4:
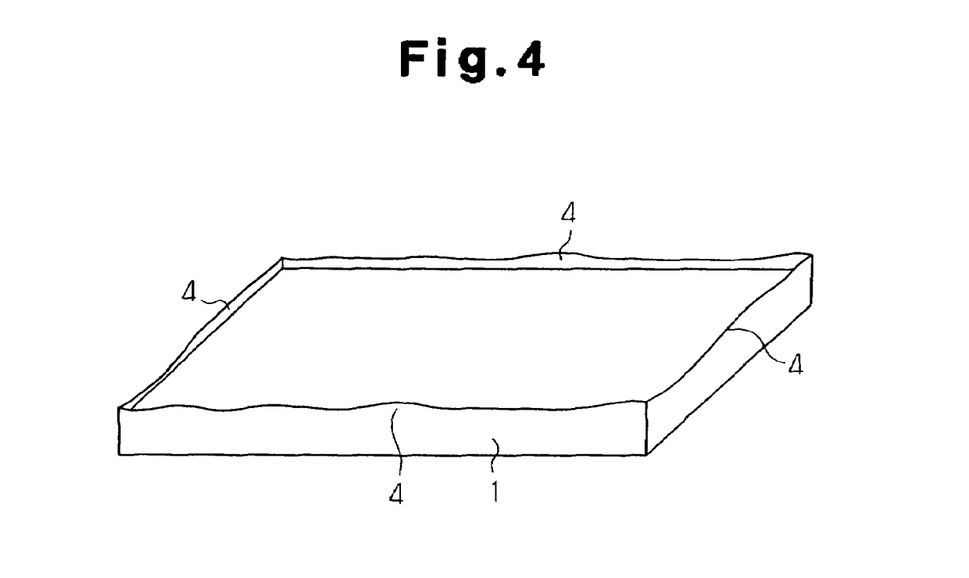
FIG. 4 is a schematic perspective view showing a metal substrate in the circuit device of FIG. 3.

FIG. 4 is a schematic perspective view showing the lower surface of the insulation board 3a of FIG. 3. As shown in FIG. 4, the projection is formed integrally with the peripheral portion of the bottom surface of the metal substrate 1.

The structure of the circuit device 10 shown in FIG. 3 will now be described referring to FIGS. 5 through 11 which show the manufacturing process of the circuit device 10. FIGS. 5a through 5m and FIGS. 6 through 8 show the processes for manufacturing the insulation board 3a of FIG. 3.

First Process (refer to FIG. 5a): A metal substrate 1 is formed with a multilayer structure (three-layer structure) having a thickness of approximately 100 µm to approximately 3 mm (for example, approximately 1.5 mm). The substrate 1 is formed by cladding material, which includes a lower metal layer 1a formed from copper, an intermediate metal layer 1b formed from an Fe—Ni alloy (so-called invar alloy) on the lower metal layer 1a, and an upper metal layer 1c formed from copper on the intermediate metal layer 1b. The copper lower metal layer 1a and upper metal layer 1c have a thermal expansion coefficient of approximately 12 ppm/° C. The invar alloy intermediate metal layer 1b includes Fe containing approximately 36% of Ni and has a low thermal expansion coefficient of approximately 0.2 ppm/° C. to 5 ppm/° C. That is, the thermal expansion coefficient of the intermediate metal layer 1b (approximately 0.2 ppm/° C. to 5 ppm/° C.) is lower than the thermal expansion coefficient of the lower metal layer 1a and upper metal layer 1c (approximately 12 ppm/° C.). The thickness ratio of the lower metal layer 1a, intermediate metal layer 1b, and upper metal layer 1c is approximately 1:1:1. This ratio is adjusted so that the thermal expansion coefficient of the substrate 1 is at approximately 6 ppm/° C. to 8 ppm/° C.

Second Process (refer to FIG. 5b): A copper oxide film 1d having a thickness of approximately 0.1 µm to 0.3 µm is formed on the upper surface of the uppermost one of the three layers (1a through 1c) forming the substrate 1, that is, the upper metal layer 1c. The copper oxide film 1d is formed by natural oxidation on the upper surface of the upper metal layer 1c. In the present embodiment, the crystal grain boundary of the substrate 1 is selectively etched so that the substrate 1 has an irregular upper surface with an arithmetic mean roughness Ra of approximately 10 to 20 µm. This increases the adhesion between the substrate 1 (copper oxide film 1d) and a resin layer formed thereon. The substrate 1 formed by the lower metal layer 1a, the intermediate metal layer 1b, the upper metal layer 1c, and the copper oxide film 1d serves as the "metal substrate" of the present invention.

Third Process (refer to FIG. 5c): A first resin layer 12, which is mainly composed of an epoxy resin and has a thickness of approximately 60 to 160 µm, is formed on the irregular surface of the substrate 1 (copper oxide film 1d). This resin layer 12 functions as an insulative layer. The resin layer 12 further has a thermal expansion coefficient of approximately 17 to 18 ppm/° C.

Figure 5A:
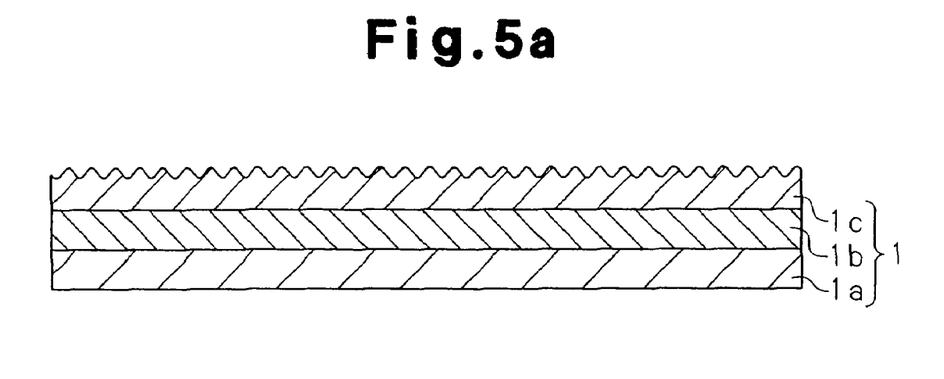
FIG. 5*a* is a cross-sectional view of a first process for manufacturing the circuit device of FIG. 3.
Figure 5B:
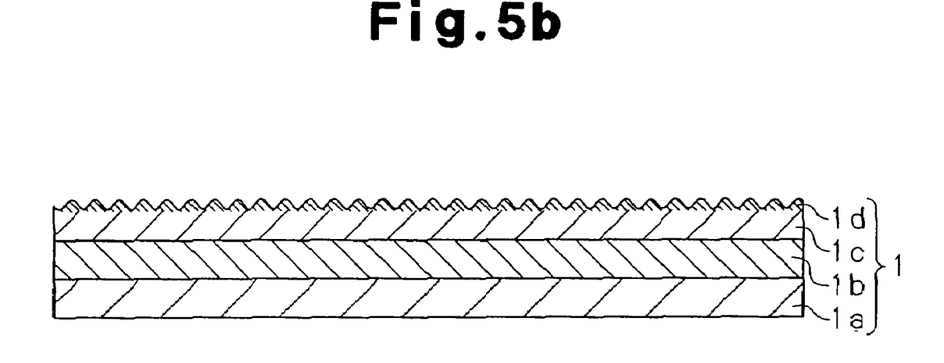
FIG. 5*b* is a cross-sectional view of a second process for manufacturing the circuit device of FIG. 3.
Figure 5C:
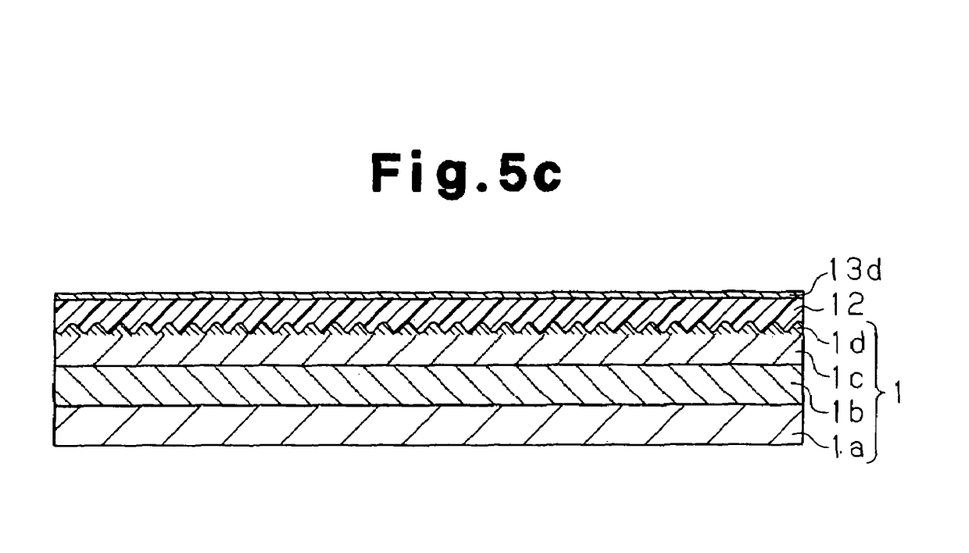
FIG. 5*c* is a cross-sectional view of a third process for manufacturing the circuit device of FIG. 3.
Figure 5D:
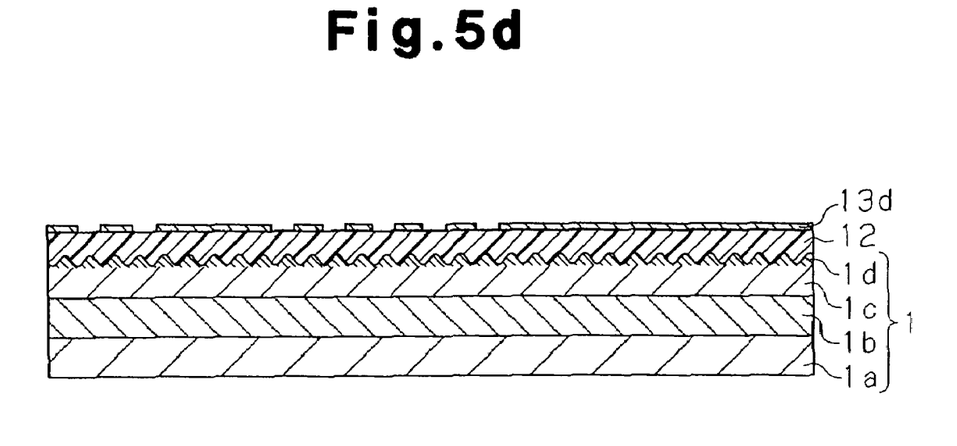
FIG. 5*d* is a cross-sectional view of a fourth process for manufacturing the circuit device of FIG. 3.
Figure 5E:
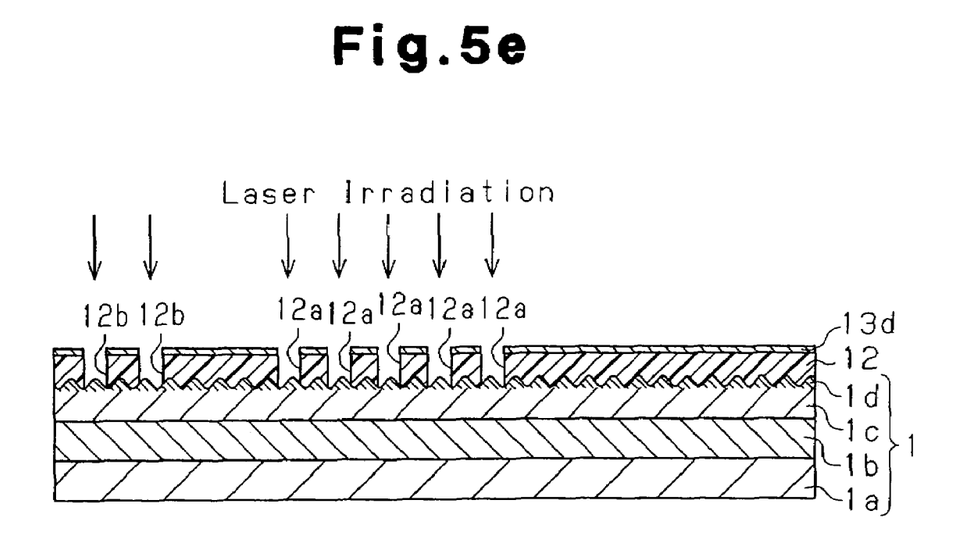
FIG. 5*e* is a cross-sectional view of a fifth process for manufacturing the circuit device of FIG. 3.

In the present embodiment, a filler having a maximum grain size of 15 µm or less is added to the resin layer 12 to increase the thermal conductivity of the resin layer 12, the main component of which is epoxy resin. The filler may be alumina ($Al_2O_3$), silica ($SiO_2$), aluminum nitride (AlN), silicon nitride (SiN), boron nitride (BN), and the like. The filler has a volume filling percentage of approximately 60 to 80%. The epoxy resin containing the added filler of alumina or silica has a thermal conductivity of approximately 2 W/(m·K), which is higher than the thermal conductivity of epoxy resin without the added filler (approximately 6 W/m·K). After forming the resin layer 12, a copper foil 13d is adhered onto the resin layer 12.

Fourth Process (refer to FIG. 5d): The copper foil 13d undergoes photolithography and etching to be patterned. This removes copper foil at locations that undergo laser irradiation to form via holes in the next process (fifth process). When a $CO_2$ laser is used, this process is required since the copper foil would reflect the majority of the laser light. When a UV laser is used, processing variations are reduced.

Fifth Process (refer to FIG. 5e): The patterned copper foil 13d is irradiated from above by a $CO_2$ gas laser or UV laser. This removes regions from the surface of the exposed resin layer 12 to the surface of the substrate 1. Thus, five via holes 12a and two via holes 12b, each having a diameter of approximately 100 µm, are formed extending through the resin layer 12. Thermal via portions 13a and 13b (refer to FIG. 5g), which will be described later, are respectively formed using the via holes 12a and 12b.

Figure 5F:
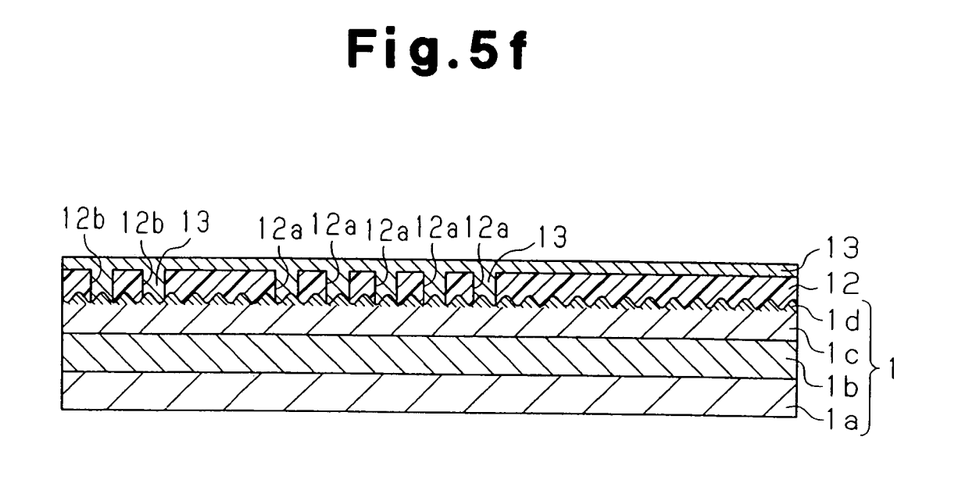
FIG. 5*f* is a cross-sectional view of a sixth process for manufacturing the circuit device of FIG. 3.
Figure 5G:
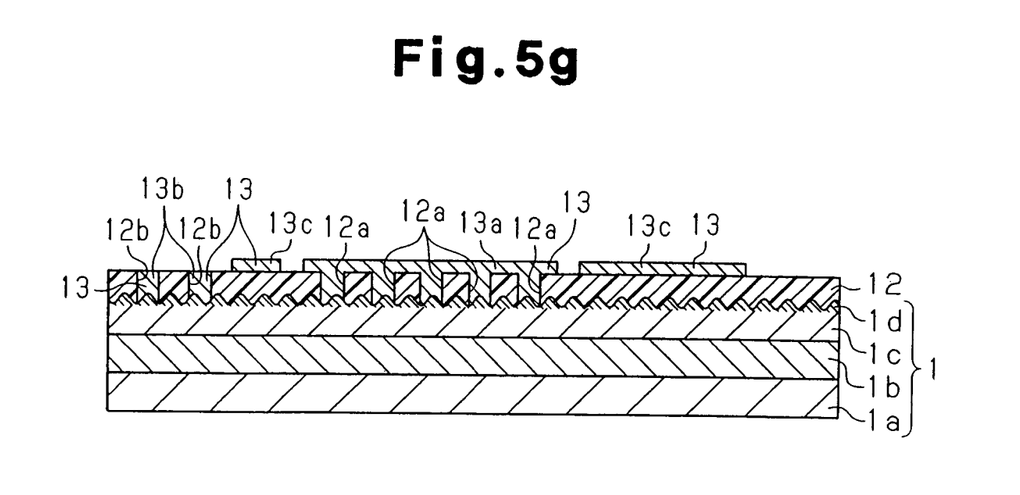
FIG. 5*g* is a cross-sectional view of a seventh process for manufacturing the circuit device of FIG. 3.
Figure 5H:
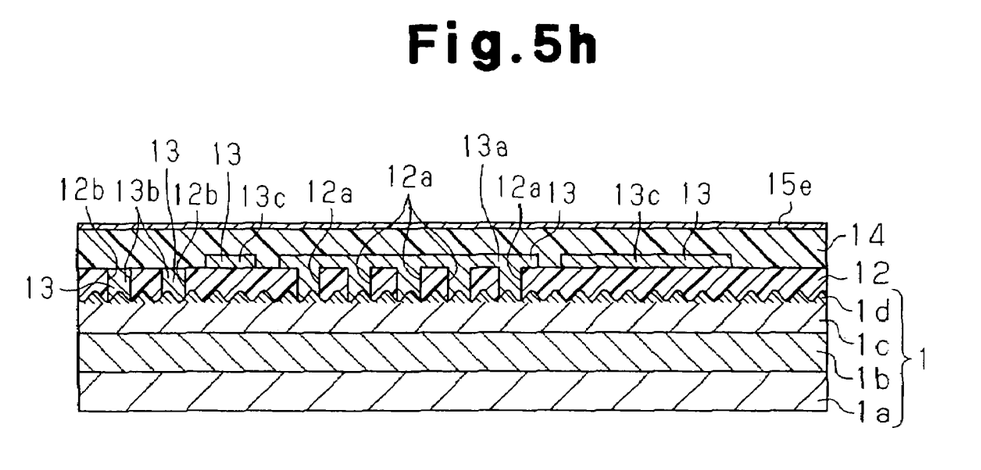
FIG. 5*h* is a cross-sectional view of an eighth process for manufacturing the circuit device of FIG. 3.
Figure 5I:
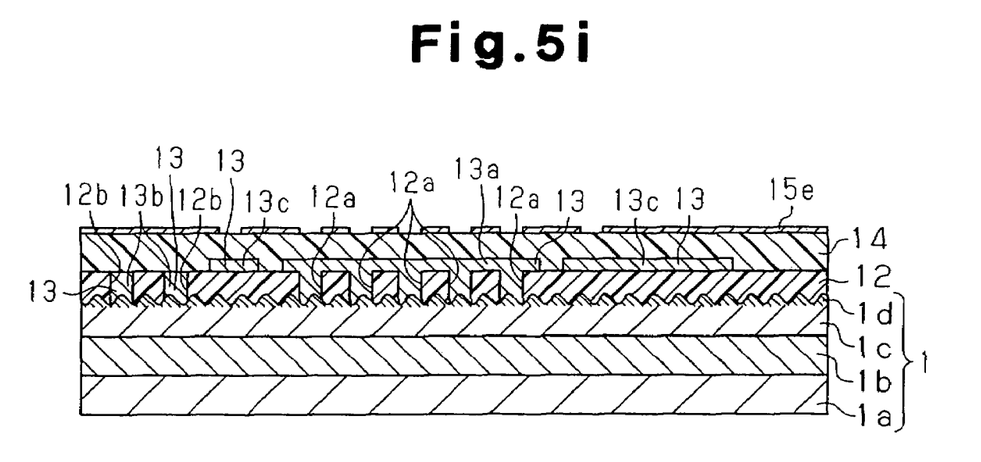
FIG. 5*i* is a cross-sectional view of a ninth process for manufacturing the circuit device of FIG. 3.
Figure 5J:
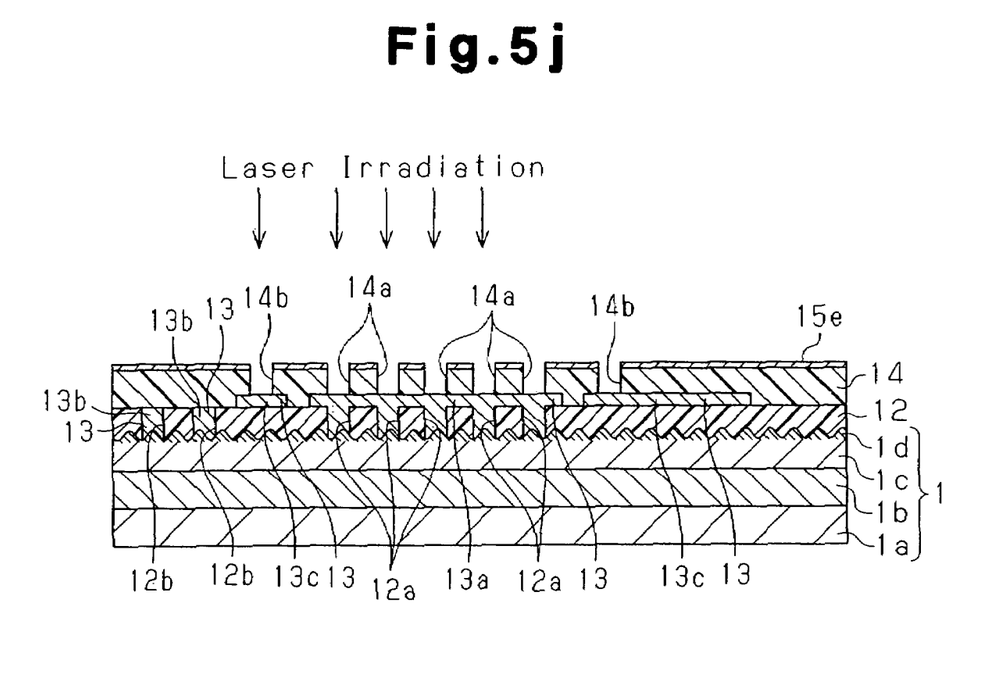
FIG. 5*j* is a cross-sectional view of a tenth process for manufacturing the circuit device of FIG. 3.
Figure 5K:
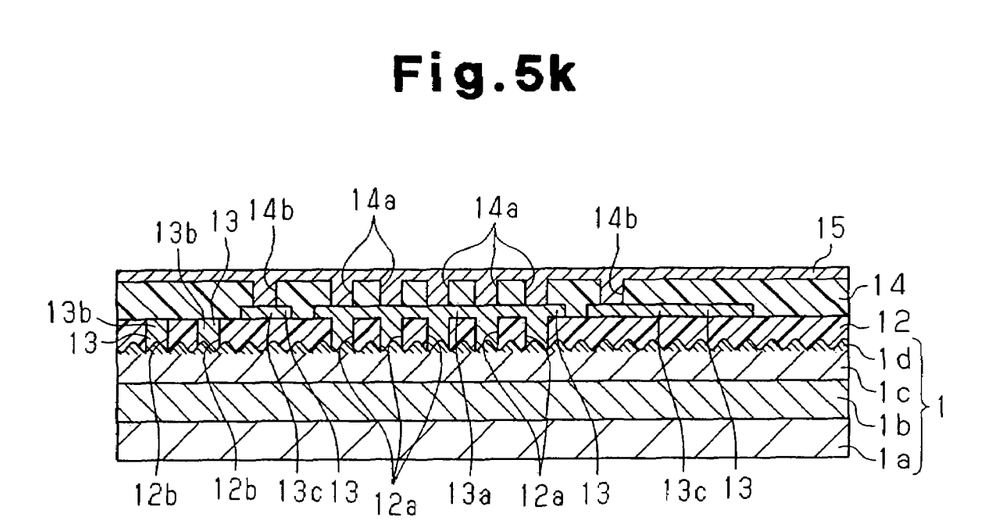
FIG. 5*k* is a cross-sectional view of an eleventh process for manufacturing the circuit device of FIG. 3.
Figure 5L:
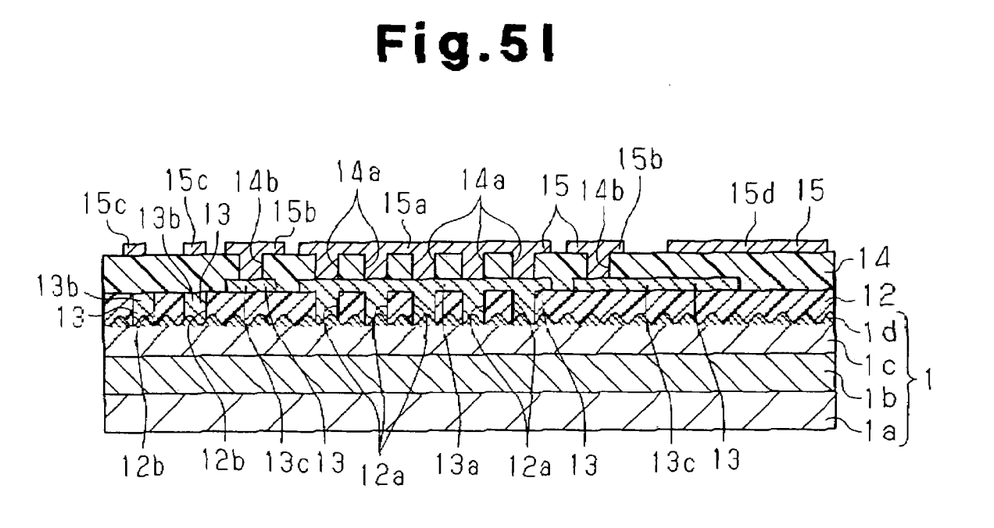
FIG. 5*l* is a cross-sectional view of a twelfth process for manufacturing the circuit device of FIG. 3.

Sixth Process (refer to FIG. 5f): Electroless plating is performed to plate copper to a thickness of approximately 0.5 µm on the upper surface of the copper foil 13d (refer to FIG. 5e) and on the surface of the via holes 12a and 12b. Then, electrolytic plating is performed to plate copper on the upper surface of the copper foil 13d and in the via holes 12a and 12b. In the present embodiment, an inhibitor and accelerant is added to the plating liquid. The inhibitor is adsorbed into the upper surface of the copper foil 13d, and the accelerant is adsorbed into the surfaces of the via holes 12a and 12b. This increases the thickness of the copper plating in the via holes 12a and 12b. As a result, a conductive layer 13 having a thickness of approximately 15 µm is formed on the resin layer 12 and embedded in the via holes 12a and 12b, as shown in FIG. 5f.

In the present embodiment, the intermediate metal layer 1b, which is formed from an invar alloy containing Fe and Ni, is interposed between the lower metal layer 1a and the upper metal layer 1c, which are formed from copper. Therefore, in the copper plating process described above, the components of the intermediate metal layer 1b, which is formed from an invar alloy, are eluted into the plating liquid. This prevents deterioration of the plating liquid.

Seventh Process (refer to FIG. 5g): Photolithography and etching are performed to pattern the conductive layer 13. This forms a thermal via portion 13a at a region that would be located below an LSI chip 19 (refer to FIG. 9), thermal via portions 13b at regions that would be located below a chip resistor 20 (refer to FIG. 9), and wiring portions 13c at regions separated from the edges of the thermal via portion 13a by a predetermined distance.

Eighth Process (refer to FIG. 5h): A prepreg formed from an epoxy resin to which a filler such as alumina or silica is added is press-fitted so as to cover the conductive layer 13. This forms a resin layer 14 having a thickness of approximately 60 to 160 µm. Then, copper foil 15e having a thickness of approximately 3 µm is press-fitted on the resin layer 14.

Ninth Process (refer to FIG. 5i): Photolithography and etching are performed to remove the copper foil 15e from positions that would be above via hole 14a and 14b (refer to FIG. 5j). This exposes the surface of the resin layer 14 at regions in which the via holes 14a and 14b are formed.

Tenth Process (refer to FIG. 5j): The copper foil 15e is irradiated from above by $CO_2$ gas laser or UV laser to remove regions from the exposed surface of the resin layer 14 to the surface of the conductive layer 13. Thus, five via holes 14a and two via holes 14b are formed to extend through the resin layer 14 having a diameter of approximately 100 µm.

Eleventh Process (refer to FIG. 5k): Electroless plating is performed to plate copper to a thickness of approximately 0.5 µm on the upper surface of the copper foil 15e (refer to FIG. 5j) and on the surfaces of the via holes 14a and 14b. Then, electrolytic plating is performed to plate copper on the upper surface of the copper foil 15e and in the via holes 14a and 14b. An inhibitor and accelerant are added to the plating liquid. The inhibitor is adsorbed into the upper surface of the copper foil 15e, and the accelerant is adsorbed into the surfaces of the via holes 14a and 14b. This increases the thickness of the copper plating in the via holes 14a and 14b. As a result, a conductive layer 15 having a thickness of approximately 15 µm is formed on the resin layer 14, and a conductive layer 15 is embedded in the via holes 14a and 14b.

Twelfth Process (refer to FIG. 5l): Photolithography and etching are performed to pattern the conductive layer 15. This forms a thermal via portion 15a at a region that would be located below the LSI chip 19 (refer to FIG. 9), wire bonding portions 15b at regions separated from the edges of the thermal via portion 15a by a predetermined distance, wiring portions 15c at regions that would be located below the chip resistor 20 (refer to FIG. 9), and a wiring portion 15d at a region that would be located below a lead 21 (refer to FIG. 9).

Thirteenth Process (refer to FIG. 5m): A solder resist layer 16a is formed so as to cover the conductive layer 15. The solder resist layer 16a functions as a protective layer for the conductive layer 15. The solder resist layer 16a is formed from a thermosetting resin such as melamine derivative, liquid crystal polymer, polyphenylene ether (PPE) resin, polyimide resin, fluororesin, phenol resin, polyamide-bis-meleimide, and the like. Liquid crystal polymer, epoxy resin, and melamine derivative are preferred materials of the solder resist layer 16a due to their superior high frequency characteristics. A filler such as $SiO_2$ or the like may be added to the solder resist layer 16a. The solder resist layer 16a may be applied to or laminated on the conductive layer 15.

Figure 5M:
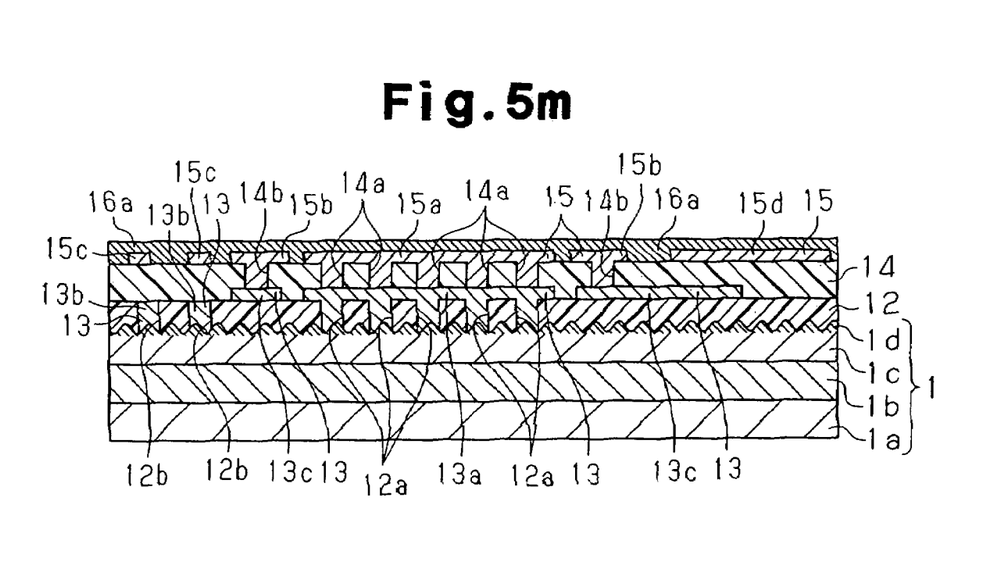
FIG. 5*m* is a cross-sectional view of a thirteenth process for manufacturing the circuit device of FIG. 3.
Figure 6:
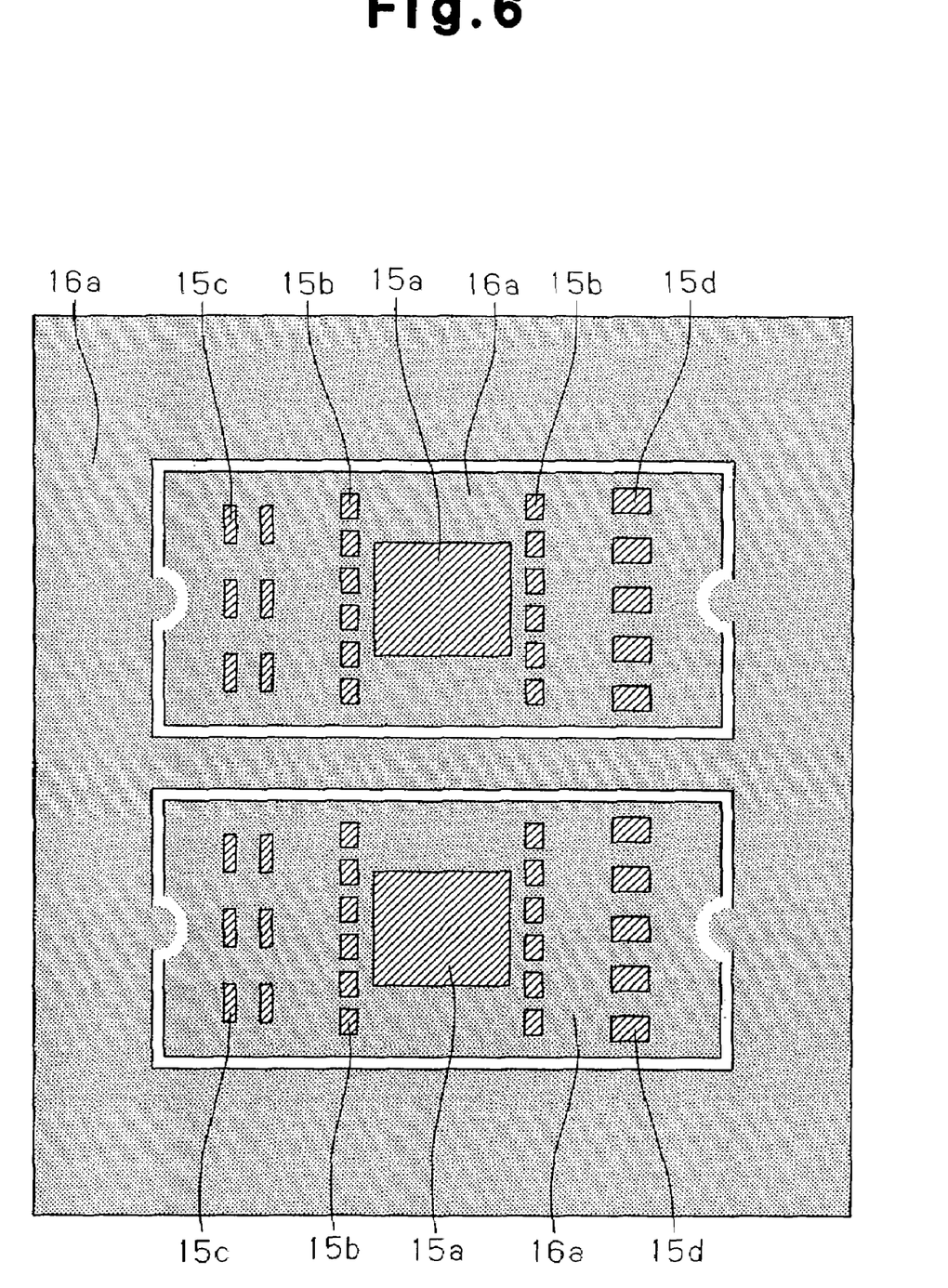
FIG. 6 is a plan view showing a fourteenth process for manufacturing the circuit device of FIG. 3.
Figure 7:
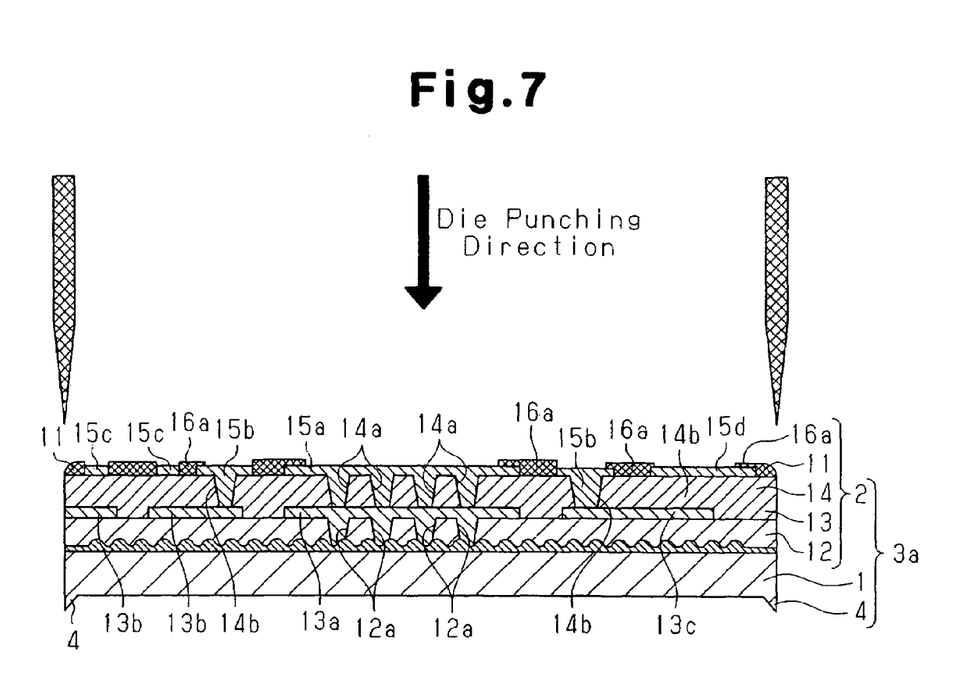
FIG. 7 is a cross-sectional view of a fifteenth process for manufacturing the circuit device of FIG. 3.

Fourteenth Process (refer to FIG. 6): A plurality of wiring layers 2, each having the structure shown in FIG. 5m, are arranged on the metal substrate 1 without excess spacing between the wiring layers 2 in order to increase productivity. FIG. 6 is a view showing the upper surface (chip mounting surface) of the insulation board 3a. In the fourteenth process, photolithography is performed to remove the solder resist layer 16a from positions above the thermal via portion 15a, the wire bonding portions 15b, and the wiring portions 15c and 15d. Furthermore, photolithography is also performed to remove parts of the solder resist layer 16a that would come into contact with the blade of a metal die (not shown) to prevent separation of the solder resist layer 16a.

Fifteenth Process (refer to FIG. 7): The insulation board 3a (circuit board) is formed using a metal die to punch out the wiring layer 2 and metal substrate 1 from the upper surface of the circuit board toward the lower surface. As a result, burrs are formed as the projection 4 on the lower surface of the insulation board 3a (that is, the lower surface of the metal substrate 1), and saggings 11 are formed on the upper surface. The projection 4 is integrally formed with the metal substrate 1 when the metal substrate 1 is deformed. A projection would not be formed on the lower surface when the metal substrate 1 is punched from the lower surface of the circuit element. In such a case, since the insulative layer is brittle, the wiring layer 2 may be separated or damaged. The projection 4 serves as the "projection" of the present invention. The projection 4 eliminates the process for preparing and installing spacers since the insulation board 3a functions as a spacer when the insulation board 3a is installed on the heat sink 8. This reduces manufacturing time and cost.

Figure 8:
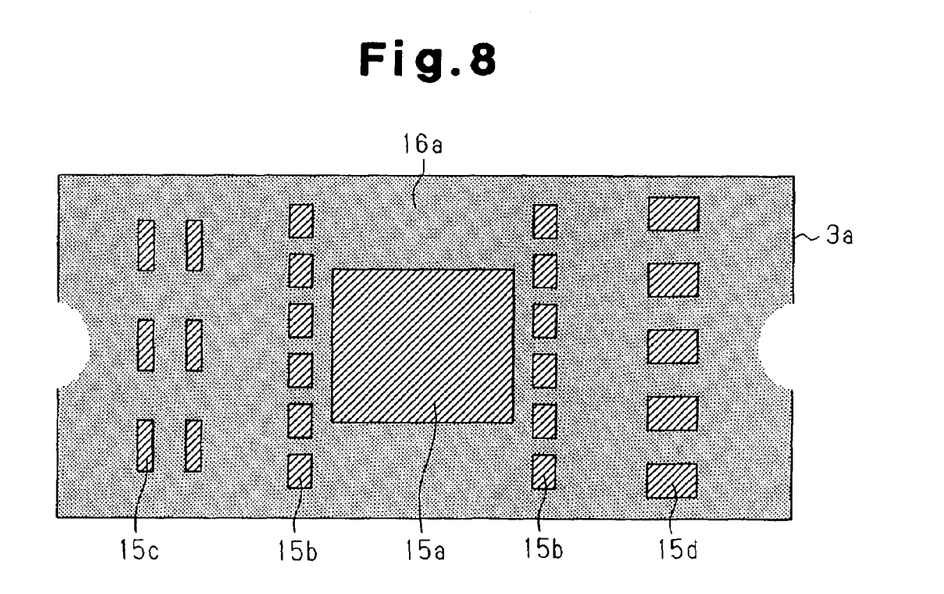
FIG. 8 is a plan view showing a sixteenth process for manufacturing the circuit device of FIG. 3.

Sixteenth Process (refer to FIG. 8): FIG. 8 shows the insulation board 3a from above after it has been punched out by the metal die. Reference numbers 15a, 15b, 15c, and 15d denote the exposed wiring layer 2 after the solder resist layer 16a has been removed through photolithographic patterning.

Seventeenth Process (refer to FIG. 9): The LSI chip 19 is installed as a circuit element 6 (refer to FIG. 3) on the thermal via portion 15a of the conductive layer 15 by means of the resin layer 16, which is formed from an epoxy resin and has a thickness of approximately 20 µm. The LSI chip 19 is formed from a monocrystal silicon substrate (not shown) having a thermal expansion coefficient of approximately 4 ppm/° C. The LSI chip 19 is electrically connected to the wire bonding portion 15b of the conductive layer 15 by a wire 17. The chip resistor 20, which serves as the a circuit element 6 (refer to FIG. 3), is installed on the wiring portion 15c of the conductive layer 15 by means of a fusion layer 18a, which is formed from a brazing material such as solder, and is electrically connected to the wiring portion 15c through the fusion layer 18a. Furthermore, the lead 21 is installed on the wiring portion 15d of the conductive layer 15 by means of the fusion layer 18b, which is formed from a brazing material such as solder, and is electrically connected to the wiring portion 15d through the fusion layer 18a.

Figure 9:
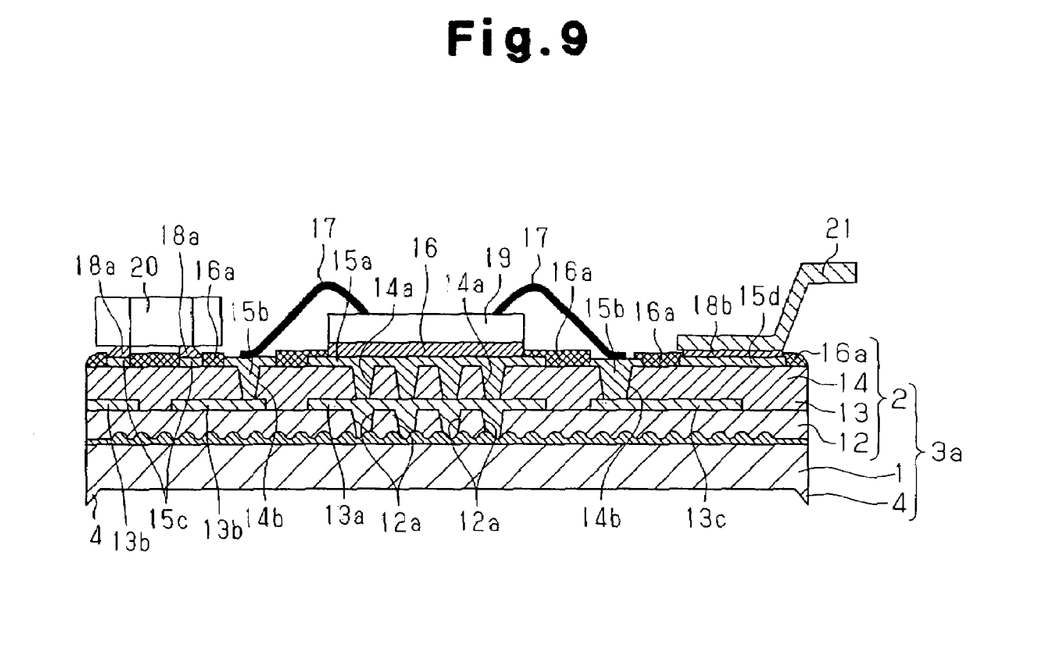
FIG. 9 is a cross-sectional view of a seventeenth process for manufacturing the circuit device of FIG. 3.
Figure 10:
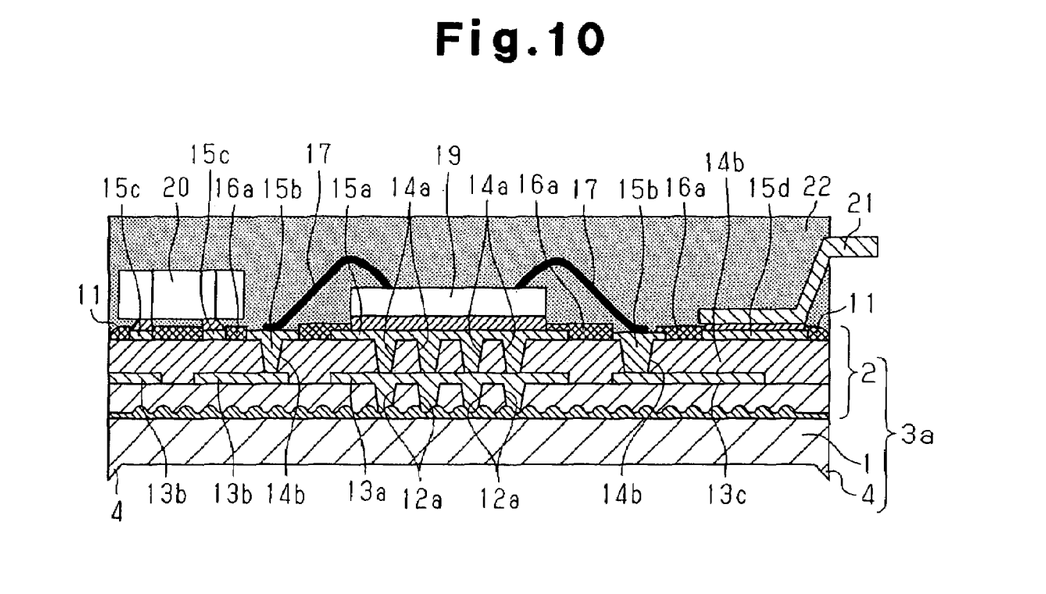
FIG. 10 is a cross-sectional view of an eighteenth process for manufacturing the circuit device of FIG. 3.

Eighteenth Process (refer to FIG. 10): An epoxy resin layer 22 is formed so as to cover and protect the LSI chip and chip resistor 20. Thus, the circuit element 6 is sealed on the insulation board 3a. As shown in FIGS. 9 and 10, the lead 21 is arranged on one side of the insulation board 3a.

Figure 13:
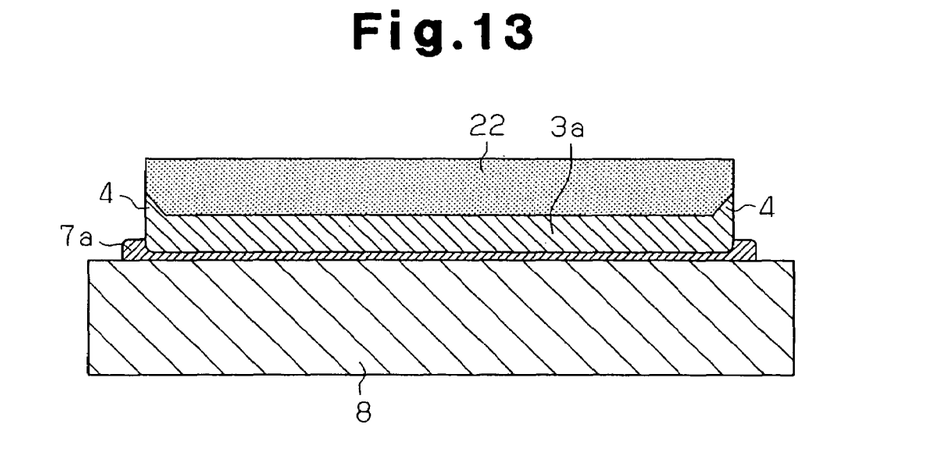
FIG. 13 is a schematic cross-sectional view showing the structure of a conventional resin-molded circuit device.

During the resin molding (eighteenth process), if the projection 4 were formed on the upper surface of the insulation board 3a (the surface facing the resin layer 22) as shown in FIG. 13, the projection 4 may interfere with the application of the resin when the resin is applied in a lateral direction of the drawing. However, in the present embodiment, the application of the epoxy resin to the insulation board is facilitated by the saggings 11 (rounded corners as shown in FIG. 10), which are produced during the punching.

Figure 11A:
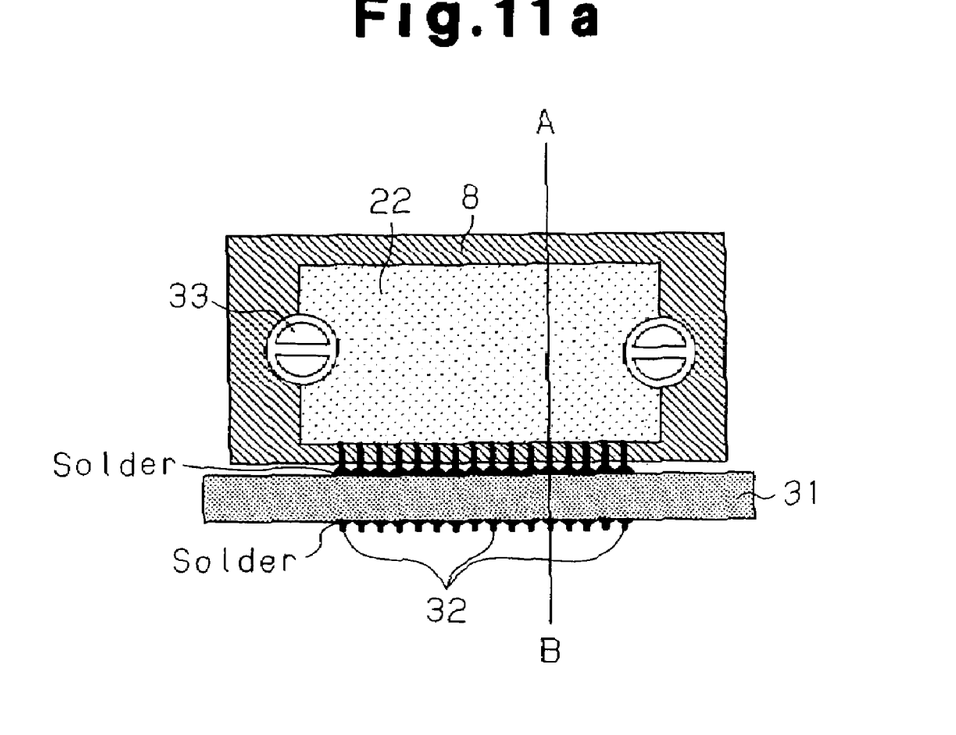
FIG. 11*a* is a plan view showing a nineteenth process for manufacturing the circuit device of FIG. 3.
Figure 11B:
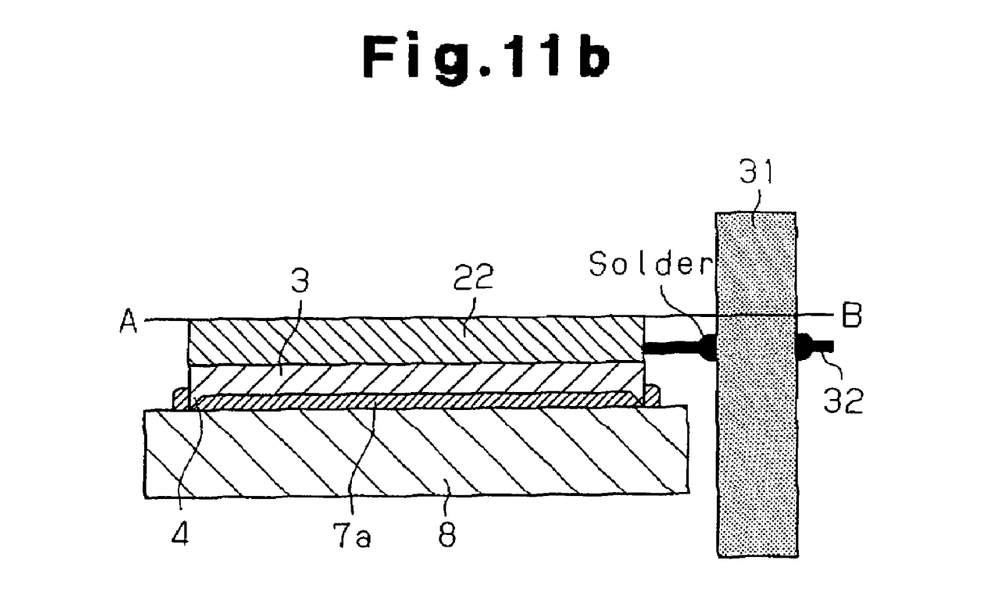
FIG. 11*b* is a cross-sectional view taken along line A-B in FIG. 11*a*.

Nineteenth Process (refer to FIGS. 11a and 11b): The insulation board 3a, which has the circuit element 6 sealed in the molded resin (resin layer 22), is installed on the heat sink 8. This forms a circuit device 10 (refer to FIG. 3). Lead pins 32 of the circuit device 10 are inserted into and soldered to a printed circuit board 31. This connects the circuit device 10 to the printed circuit board 31. FIG. 11a is a plan view of the circuit device 10, and FIG. 11b is a cross-section view taken along line A-B in FIG. 11a. The lead pins 32 are integrally connected (not shown) to the lead 21 (refer to FIG. 10) by extending the lead 21. Therefore, the lead pins 32 and the lead 21 (refer to FIG. 10) are equivalent.

The insulation board 3a of the circuit device 10 is fastened by screws 33 (refer to FIG. 11a) to the heat sink 8 with the heat radiating grease 7a arranged in between. When fastening the insulation board 3a, the insulation board 3a and heat sink 8 are securely bonded with each other (refer to FIG. 11b) by the anchor effect of the projection 4 (that is, the effect produced by the peaks on the projection 4 functioning as pegs or a wedge when the peaks enter fine recesses in the surface of the heat sink 8). Furthermore, the projection 4 includes sections free from contact with the heat sink 8 since the projection 4, which substantially extends along the entire periphery of the insulation board 3a, does not necessarily have a uniform height (refer to FIG. 4). Such non-contact sections enable the release of air mixed in the heat radiating grease 7a so that heat radiation is not hindered.

The circuit device 10 of the embodiment of the present invention has the advantages described below.

(1) The bottom surface of the insulation board 3a, which is installed on the heat sink 8 with the heat radiating grease 7a arranged in between, has a projection 4 (burrs) formed on the peripheral portion through punching. The projection 4 functions as a spacer to maintain a constant distance between the heat sink 8 and the insulation board 3a. Therefore, the entire insulation board 3a has uniform heat radiating characteristics.

(2) The pressure per contact area is improved between the insulation board 3a and the heat sink 8 since the projection 4 supports the insulation board 3a relative to the heat sink 8 in the manner of legs. Thus, the vertical resistance and friction force are increased. Therefore, when the insulation board 3a is installed on the heat sink 8, the insulation board 3a remains stable even when receiving external forces. This facilitates the positioning of the insulation board 3a. Moreover, the stability prevents displacement of the insulation board 3a.

(3) The projection 4 is arranged along the peripheral portion of the insulation board 3a. This minimizes the possibility of the insulation board 3a being inclined relative to the heat sink 8.

(4) The projection 4 is formed integrally with the insulation board 3a. This prevents separation of the insulation board 3a at the interface between the insulation board 3a and the heat radiating grease 7a when the temperature increases.

Figure 12:
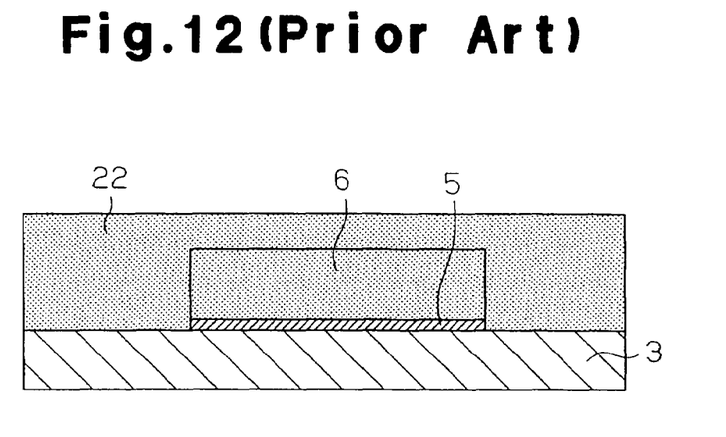
FIG. 12 is a schematic cross-sectional view showing the structure of a conventional resin-molded circuit device.

(5) As shown in FIG. 12, the molded resin (resin layer 22) on the insulation board 3a is generally formed using silica as a filler, and the thermal expansion coefficient is approximately $15 \times 10^{-6}$/K. The metal substrate 1 in the insulation board 3a, however, is mainly formed of copper, which has a thermal expansion coefficient of about $16.6 \times 10^{-6}$/K. Thus, since the thermal expansion coefficient of the molded resin is lower than the metal substrate 1, the lower surface of the metal substrate 1 bends upward in the insulation board 3a when the temperature rises. However, in the present embodiment, the projection 4 (refer to FIG. 10) is formed integrally with the metal substrate 1. This improves the rigidity of the metal substrate 1 and prevents such bending.

It should be apparent to those skilled in the art that the present invention may be embodied in many other specific forms without departing from the spirit or scope of the invention. Particularly, it should be understood that the present invention may be embodied in the following forms.

(First Modification) The present invention is also applicable to hybrid integrated circuit devices that have circuit elements 6 other than the LSI chip 19 and chip resistor 20 and to semiconductor integrated circuit devices other than a hybrid integrated circuit device.

(Second Modification) The second process (process for forming the copper oxide film 1d) may be omitted. A copper nitride film may be formed on the surface of the substrate 1, in lieu of the copper oxide film 1d, by nitriding the surface of the substrate 1.

(Third Modification) The substrate 1 may also be formed by interposing the intermediate metal layer 1b, which is formed from an invar alloy, between a lower metal layer 1a and upper metal layer 1c, which are formed from aluminum. Alternatively, the substrate 1 may be formed by interposing the intermediate metal layer 1b, which is formed from an invar alloy, between a copper lower metal layer 1a (or upper metal layer 1c) and an aluminum to metal layer 1c (or lower metal layer 1a). When the upper metal layer 1c is formed of aluminum, the surface of the upper metal layer 1c may be oxidized using an anodic oxidation method such that an aluminum oxide film can be accurately formed on the surface of the upper metal layer 1c to function as an insulative layer. An intermediate metal layer 1b formed of an alloy containing approximately 32% Ni and approximately 5% Co in Fe (so-called super invar alloy), and an intermediate metal layer 1b formed of an alloy containing approximately 29% Ni and approximately 17% Co in Fe may be used in place of the invar alloy intermediate metal layer 1b.

(Fourth Modification) The thickness ratio of the lower metal layer 1a, intermediate metal layer 1b, and upper metal layer 1c need not be 1:1:1, and may be set, for example, at 1:3:1.

(Fifth Modification) The circuit device 10 is not limited to a bi-layer structure (conductive layers 13 and 15). The circuit device 10 may have a monolayer structure (for example, the conductive layer 13 alone). The circuit device 10 may have a tri-layer structure that includes a third insulative layer and conductive layer on a second conductive layer. The circuit device 10 may have a multi-layer structure of four or more layers.

(Sixth Modification) The maximum grain size of the filler material added to the resin layer 12 is not limited to 15 μm. The resin layer 12 may also include a filler having a grain size of approximately 15 μm and a filler having a grain size of approximately 0.7 μm.

(Seventh Modification) The metal substrate 1 is not limited to a tri-layer structure that includes the lower metal layer 1a, intermediate metal layer 1b, and upper metal layer 1c. The metal substrate 1 may also have a multi-layer structure of four or more layers. Further, the metal substrate 1 may include at least one of a resin layer, a ceramic layer, and a semiconductor layer.

Figure 16:
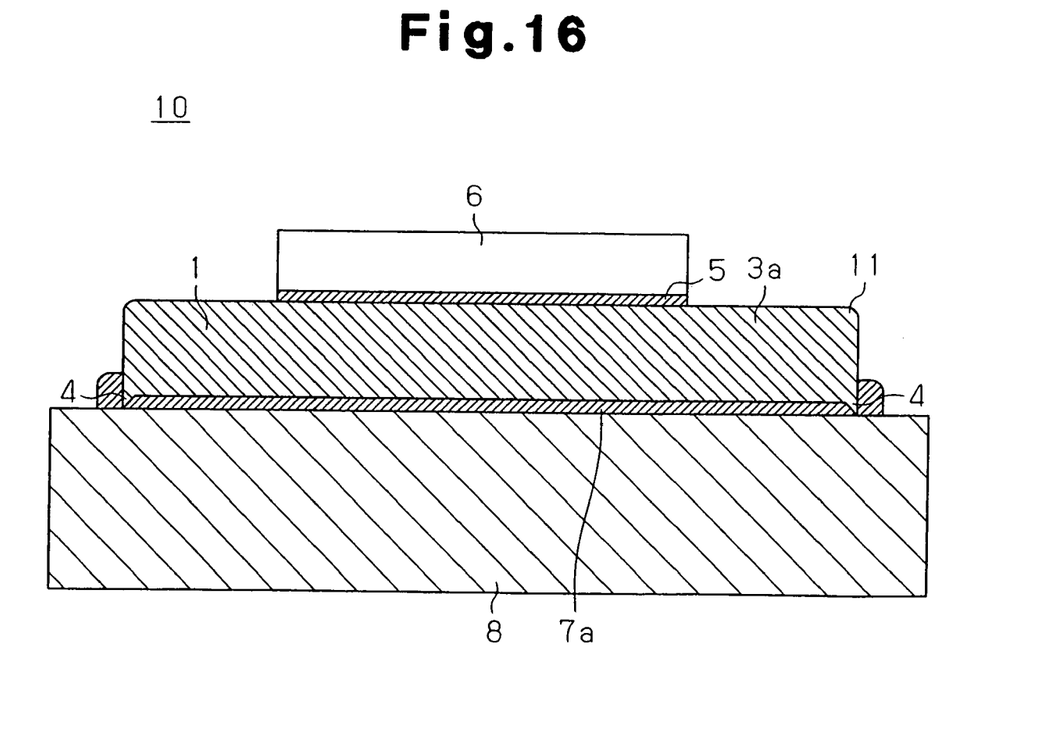
FIG. 16 is a schematic cross-sectional diagram of a circuit device according to a further embodiment of the present invention.

(Eighth Modification) The insulation board 3a (circuit board) may be formed by only the metal substrate 1, as shown in FIG. 16.

Figure 14:
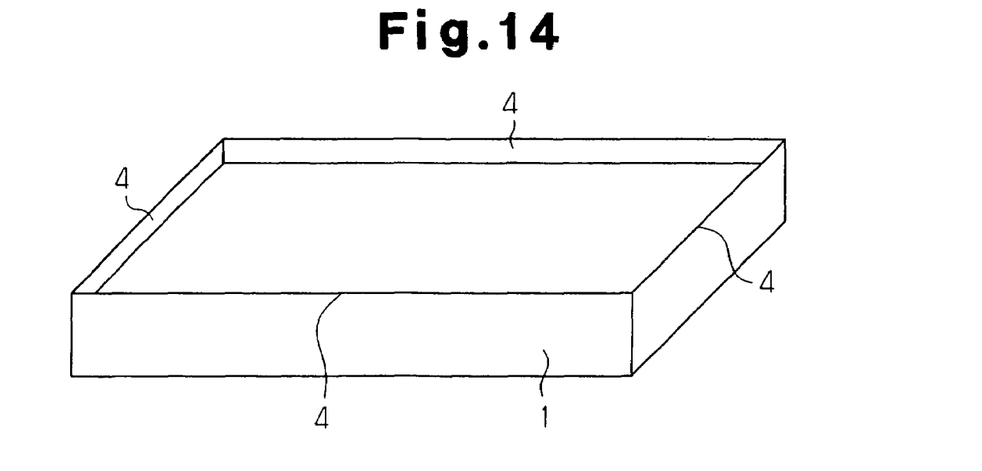
FIG. 14 is a schematic perspective view of the metal substrate according to a further embodiment of the present invention.
Figure 15:
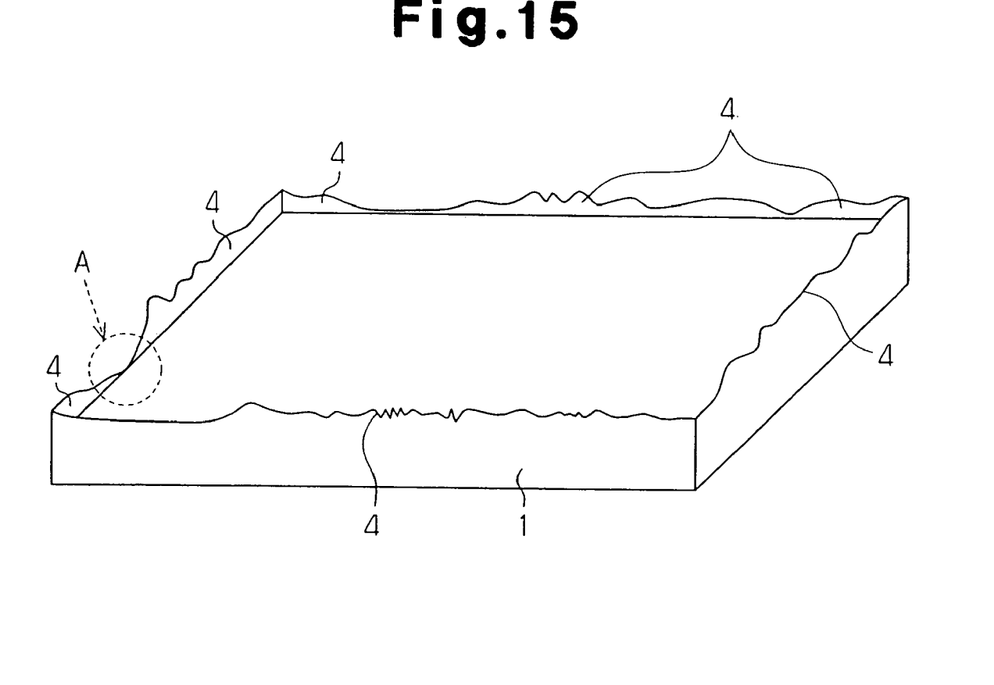
FIG. 15 is a schematic perspective view of the metal substrate according to a further embodiment of the present invention.

(Ninth Modification) In addition to the projection 4 that changes height in long intervals along the peripheral portion of the metal substrate 1 (refer to FIG. 4), the "projection" of the present invention may be a projection 4 having a substantially uniform height along the entire peripheral portion (refer to FIG. 14) or a projection 4 that changes height in short intervals along the peripheral portion (refer to FIG. 15). The "projection" may also be absent at certain parts in the peripheral portion, as indicated by arrow A in FIG. 15.

(Tenth Modification) The projection 4 is not limited to burrs formed when punching the insulation board 3a with a metal die. A new process may be added to form a projection 4 that is not a burr.

(Eleventh Modification) The method for adhering the circuit element 6 to the insulation board 3a is not limited to soldering. For example, a wire attached to the circuit element 6 may function as a leg to support the circuit element 6 on the insulation board 3a.

(Twelfth Modification) The "paste" is not limited to thermally conductive grease (heat radiating grease 7a) and also includes adhesives or an insulative layer and resin layer used for adhesive purposes.

The present examples and embodiments are to be considered as illustrative and not restrictive, and the invention is not to be limited to the details given herein, but may be modified within the scope and equivalence of the appended claims.

What is claimed is:

1. A circuit device comprising:
    a heat sink;
    a circuit board arranged over the heat sink, the circuit board having a peripheral portion and a first surface facing toward the heat sink; and
    a paste arranged between the circuit board and the heat sink;
    wherein the circuit board includes a projection arranged on the first surface along the peripheral portion, wherein the projection is a burr, with a distal portion of the burr extending through the paste and contacting the heat sink by anchor effect of the burr.

2. The circuit device according to claim 1, wherein the circuit board includes a metal substrate having at least the first surface, wherein the projection is formed integrally with the metal substrate.

3. The circuit device according to claim 1, wherein the projection includes a section free from contact with the base member.

4. The circuit device according to claim 1, wherein the circuit board has a second surface opposite the first surface, the circuit board further including:
    a sagging formed on the second surface along the peripheral portion.

5. The circuit device according to claim 1, wherein the projection is formed so as to have different heights along the peripheral portion.

6. The circuit device according to claim 1, wherein the projection is formed so as to have a substantially uniform height along the peripheral portion.

7. The circuit device according to claim 1, wherein the projection is formed entirely or partially along the peripheral portion.

8. The circuit device according to claim 1, wherein the circuit board includes:
    a metal substrate having the first surface; and
    a wiring layer having a second surface opposite the first surface, wherein the projection is formed integrally with the metal substrate.

9. The circuit device according to claim 8, wherein the circuit board further includes:
    a sagging formed on the second surface along the peripheral portion.

10. The circuit device according to claim 9, wherein the metal substrate includes:
    a plurality of metal layers including a metal layer having the first surface.

* * * * *